United States Patent [19]
Boe

[11] Patent Number: 6,052,892
[45] Date of Patent: Apr. 25, 2000

[54] ADAPTOR TOOL FOR MOUNTING COMPONENTS ON PRINTED CIRCUIT BOARDS

[75] Inventor: Craig L. Boe, Nampa, Id.

[73] Assignee: Micron Electronics, Inc., Boise, Id.

[21] Appl. No.: 08/965,695

[22] Filed: Nov. 7, 1997

[51] Int. Cl.⁷ .................................................. B23P 19/04
[52] U.S. Cl. .............................. 29/758; 29/240; 29/764; 81/3.4; 81/57.33
[58] Field of Search .................................. 29/240–0, 263, 29/750, 751, 752, 758, 762, 764; 81/3.4, 57.33

[56] References Cited

U.S. PATENT DOCUMENTS

| 1,504,964 | 8/1924 | Newland | 81/90.8 |
| 1,766,778 | 6/1930 | Deluca | 81/90.2 |
| 2,444,371 | 6/1948 | Riccio | 81/176.3 |
| 2,959,994 | 10/1960 | Kile | 81/64 |
| 3,240,086 | 3/1966 | Way | 81/111 |
| 3,632,973 | 1/1972 | O'Keefe . | |
| 3,758,992 | 9/1973 | Olson | 49/489 |
| 3,910,140 | 10/1975 | Rose | 81/90 B |
| 4,174,566 | 11/1979 | Smith | 29/758 |
| 4,641,538 | 2/1987 | Heyraud . | |
| 4,774,864 | 10/1988 | Dossier | 81/474 |
| 4,823,602 | 4/1989 | Christensen, Jr. | 73/661 |
| 4,945,791 | 8/1990 | Herschler et al. | 81/120 |
| 5,132,875 | 7/1992 | Plesinger . | |
| 5,176,050 | 1/1993 | Sauer et al. | 81/471 |
| 5,191,511 | 3/1993 | Sawaya . | |
| 5,353,193 | 10/1994 | Chia et al. . | |
| 5,359,493 | 10/1994 | Chiu | 361/719 |
| 5,542,468 | 8/1996 | Lin | 165/80.3 |
| 5,553,373 | 9/1996 | Sprayberry | 29/758 |
| 5,568,683 | 10/1996 | Chia et al. | 29/832 |
| 5,638,258 | 6/1997 | Lin | 361/704 |

Primary Examiner—S. Thomas Hughes
Assistant Examiner—Bobby Rushing
Attorney, Agent, or Firm—Knobbe, Martens, Olson & Bear, LLP

[57] ABSTRACT

An adaptor tool for mounting components on printed circuit boards. The adaptor tool has two capture members that define an opening sized to receive the component. The capture members are linked together such that the application of torque to the adaptor tool by a torque tool via a connector results in the two capture members frictionally engaging the component and transferring the torque to the component. This allows the component to be mounted to the printed circuit board to a desired degree of torque. The adaptor tool can be sized so as to be able to mount a cylindrical heat sink to a bracket on a printed circuit board to a desired degree of torque.

21 Claims, 3 Drawing Sheets

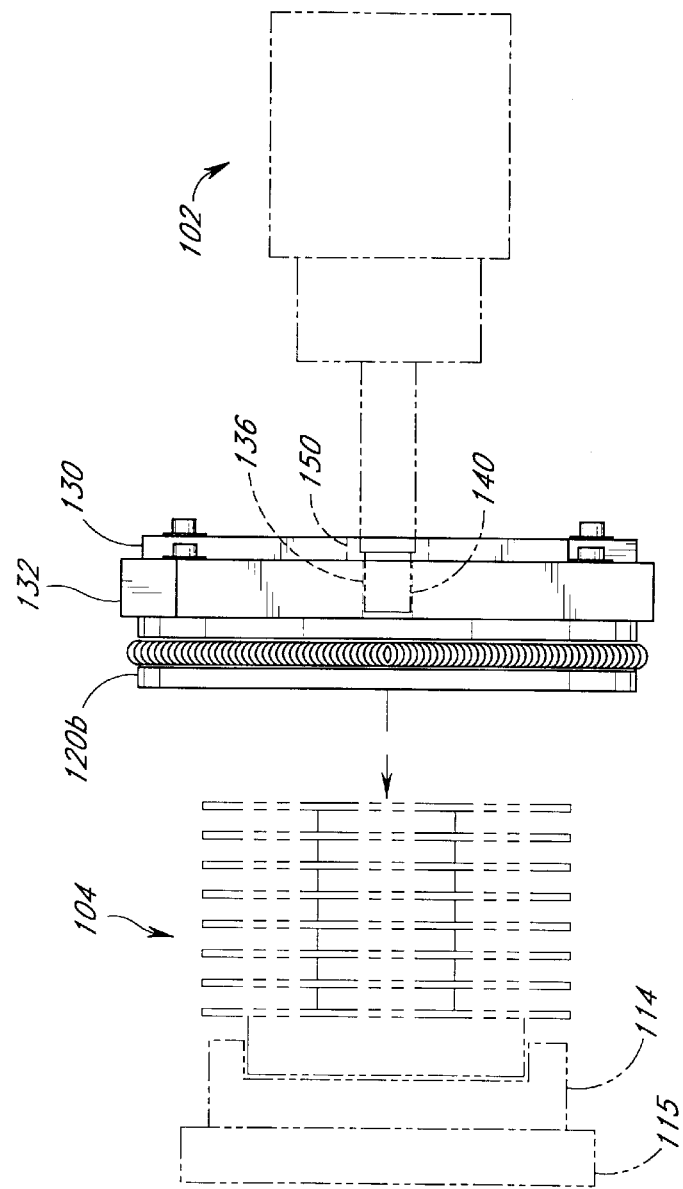
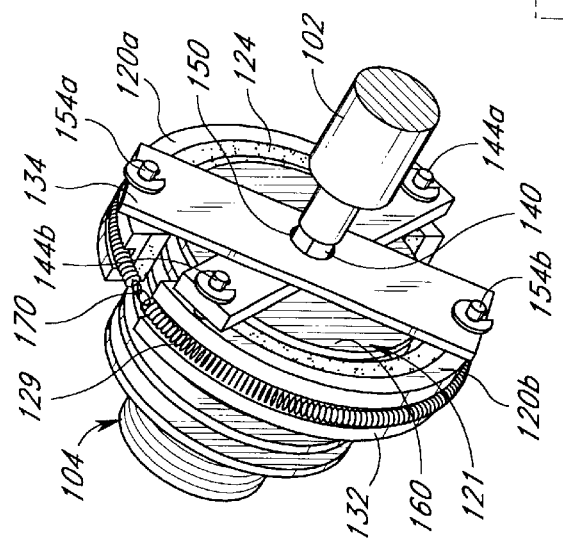

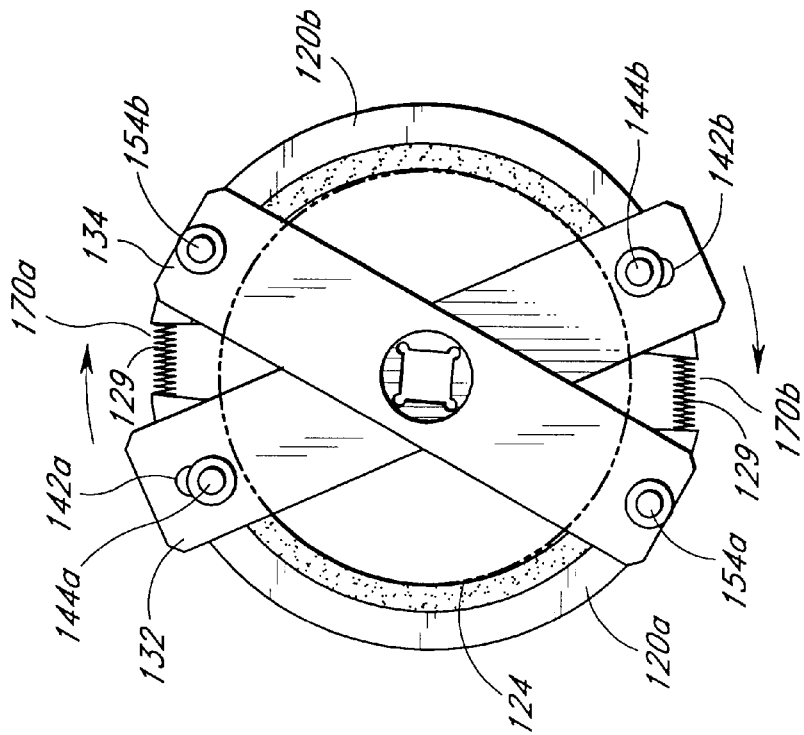
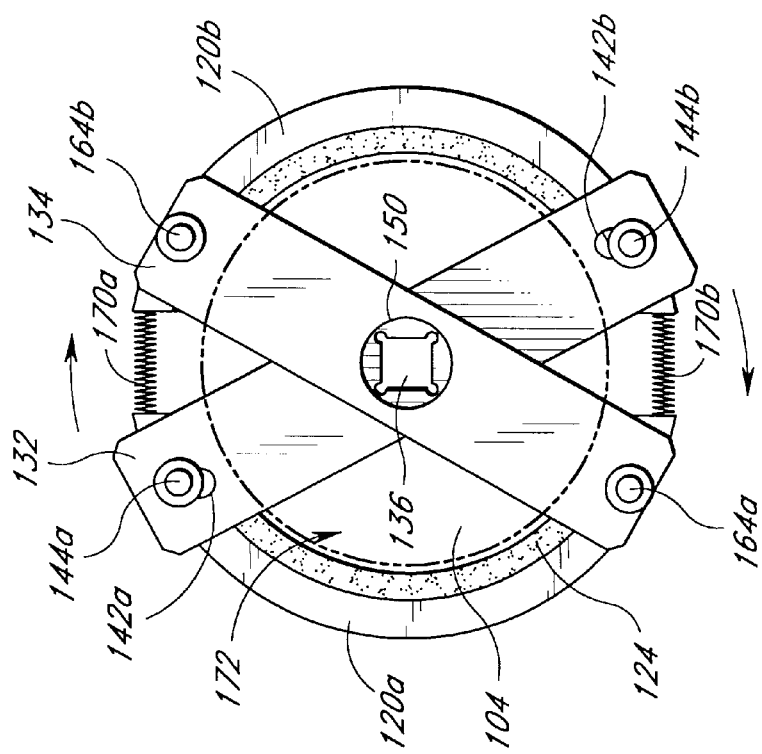

ADAPTOR TOOL FOR MOUNTING COMPONENTS ON PRINTED CIRCUIT BOARDS

RELATED APPLICATION

The subject matter of U.S. Patent entitled "METHOD OF MOUNTING COMPONENTS ON PRINTED CIRCUIT BOARDS," filed on Nov. 7, 1997, Application Ser. No. 08/965,758, now U.S. Pat. No. 5,903,972, and having attorney Docket No. MPATENT.036A, is related to this application.

BACKGROUND OF THE INVENTION

1. Field of the Invention

The invention relates to an adaptor tool for mounting generally circular or cylindrical components and, more particularly, concerns an adaptor tool for mounting electronic components such as cylindrical heat sinks in electronic applications.

2. Description of the Related Art

The increasing miniaturization of electronics has resulted in the ability to fabricate increasingly complex devices. Anyone who is familiar with the circuit boards used in personal computers will recognize that a tremendous number of components have to be mounted on these boards. The components include such things as integrated circuits, discrete circuit components, wiring, and electromechanical devices such as fans, disk drives and the like. The assembly cost of manufacturing a printed circuit board has increased with the increased complexity of the printed circuit board. Further, the actual assembly task is complicated by the greater density of components on the board as there is less room to allow assemblers to correctly position components on the board. This can result in assemblers being less efficient or even misassembling the boards.

One particular problem that occurs during board assembly is that the assembler may over-tighten or over-torque a component that is being mounted on the board. This can result in the component or the mount for the component being damaged. When components or their mounts are damaged as a result of over-tightening, the overall cost of producing the boards is increased as oftentimes the components, the mounts or even the board has to be replaced. Consequently, there is a need for mounting procedures and mounting tools that will allow for components to be mounted on printed circuit boards in such a manner that the components or the mount are not damaged as a result of the mounting process.

One such tool for mounting components is known as a torque tool. A torque tool will torque a fastener, such as a nut or screw, to only a preset amount of torque. This reduces the likelihood of damage to a component or to the board as a result of over-tightening the fastener. While these torque tools are very well suited for attaching fasteners to a board at a desired degree of torque, many components in the electronics field are not attached to the board through the use of such well known fasteners. These types of components generally include integral attachment mechanisms such as threads and the like. Consequently, torque tools cannot be used for these types of components.

An example of one such component is a circular heat sink that is typically mounted on top of an integrated circuit. The circular heat sink is generally cylindrical in shape and includes an attachment mechanism such as threads. The circular heat sink is mounted to the top of an integrated circuit so as to be in thermal contact with the integrated circuit to thereby allow the heat generated by the integrated circuit to be radiated away. Typically, circular heat sinks are mounted to integrated circuits through the use of a bracket. The bracket is initially glued or otherwise attached to the outer casing of the integrated circuit and the bracket defines an opening through which a first end of the circular heat sink is threadably engaged. The assembler grasps the cylindrical heat sink, positions it in the bracket and then twists it so as to tighten it to the bracket.

The overall configuration of the circular heat sink generally precludes the use of well-known torque tools. Consequently, the assemblers of printed circuit boards often screw the circular heat sinks into the brackets by hand. This is a very imprecise way of mounting the heat sink as the assembler is generally not able to determine the extent to which the heat sink has been positioned in the bracket. Mounting the heat sink in the bracket by hand can result in either the brackets being broken when the assembler over-tightens the heat sink, or can result in the heat sink not being properly attached to the bracket and therefore functioning inefficiently.

Hence, there is a need for an apparatus or method of attaching electrical components, such as circular heat sinks, to printed circuit boards in a manner which reduces the likelihood of damage to the printed circuit board or the component and still ensures that the component is properly mounted on the printed circuit board. To this end there is a need for an apparatus for attaching electrical components to printed circuit boards in such a way that the printed circuit board will be attached to a desired degree of torque to the printed circuit board.

SUMMARY OF THE INVENTION

The aforementioned needs are satisfied by the adaptor tool of the present invention which includes a capture member and a connector. The capture member is dimensioned so as to be positioned about an electrical component and is further configured so that when an adaptor tool is engaged with the connector such that torque is applied, the torque is transmitted through the capture member to the component. In one embodiment, the capture section defines an opening that has the same geometric shape as an outer perimeter of the component, however the cross sectional area of the opening is greater than the cross sectional area of the component. The capture section is adapted so that the application of torque to the adaptor section results in the cross sectional area of the opening diminishing so that the inner walls of the opening engage with the outer perimeter of the component to permit torque to be transmitted thereto.

In one embodiment, the present invention is comprised of a first member and a second member that are dimensioned so as to engage with an electrical component and a linkage system linking the first and second members which also define a receptacle for a torque tool. The linkage system is configured so that when a torque tool is positioned within the receptacle and torque is applied with the torque tool, the first and second members engage with the electrical component so that the component can be mounted on an electronics mounting platform, such as a printed circuit board, with a desired degree of torque being applied to the component.

In one embodiment of the present invention, the first and second members are circular in shape and are dimensioned so as to be positionable about the outer periphery of a cylindrical component. The linkage system is further configured so that when torque is applied to the linkage, the linkage system urges the first and second members in closer proximity to one another so that the cylindrical component is captured therebetween to permit the transfer of torque to the component.

In another particular embodiment, the linkage is comprised of a first and second linkage member each having a first and second end. Each end of the first and second linkage members is attached to the first and second members. The first linkage member defines the receptacle for the torque tool and the first and second ends of the first linkage member are slidably engaged with the first and second member so that torque applied at the receptacle results in sliding movement of the first member with respect to the first linkage member. In this embodiment, the second linkage member is pivotally attached to the first and second members in a manner where only pivotal movement of the first and second members with respect to the second linkage member is allowed. Consequently, the application of torque to the receptacle results in the first member moving towards the second member. The range of relative motion is selected so that the opening defined by the first and second members closes on the component to thereby permit the torque to be transferred to the component.

The adaptor tool of this embodiment therefore provides an adaptor tool which permits circular components having a circular cross-section to be mounted on printed circuit boards to a desired degree of torque. This reduces the likelihood of cylindrical components such as cylindrical heat sinks from being either over-tightened or under tightened when being mounted on printed circuit boards. These and other objects and advantages of the present invention will become more readily apparent from the following discussion taken in conjunction with the accompanying drawings.

BRIEF DESCRIPTION OF THE DRAWINGS

FIG. 2 is a perspective view of the adaptor tool of FIG. 1 as mounted on the component;

FIG. 3 is a side elevational view of the adaptor tool of FIG. 1;

FIG. 4 is a top view of the adaptor tool of FIG. 1 mounted in a first orientation on the component; and FIG. 5 is the torque tool of FIG. 1 mounted in a second orientation on the component.

DETAILED DESCRIPTION OF THE INVENTION

Figure 1:
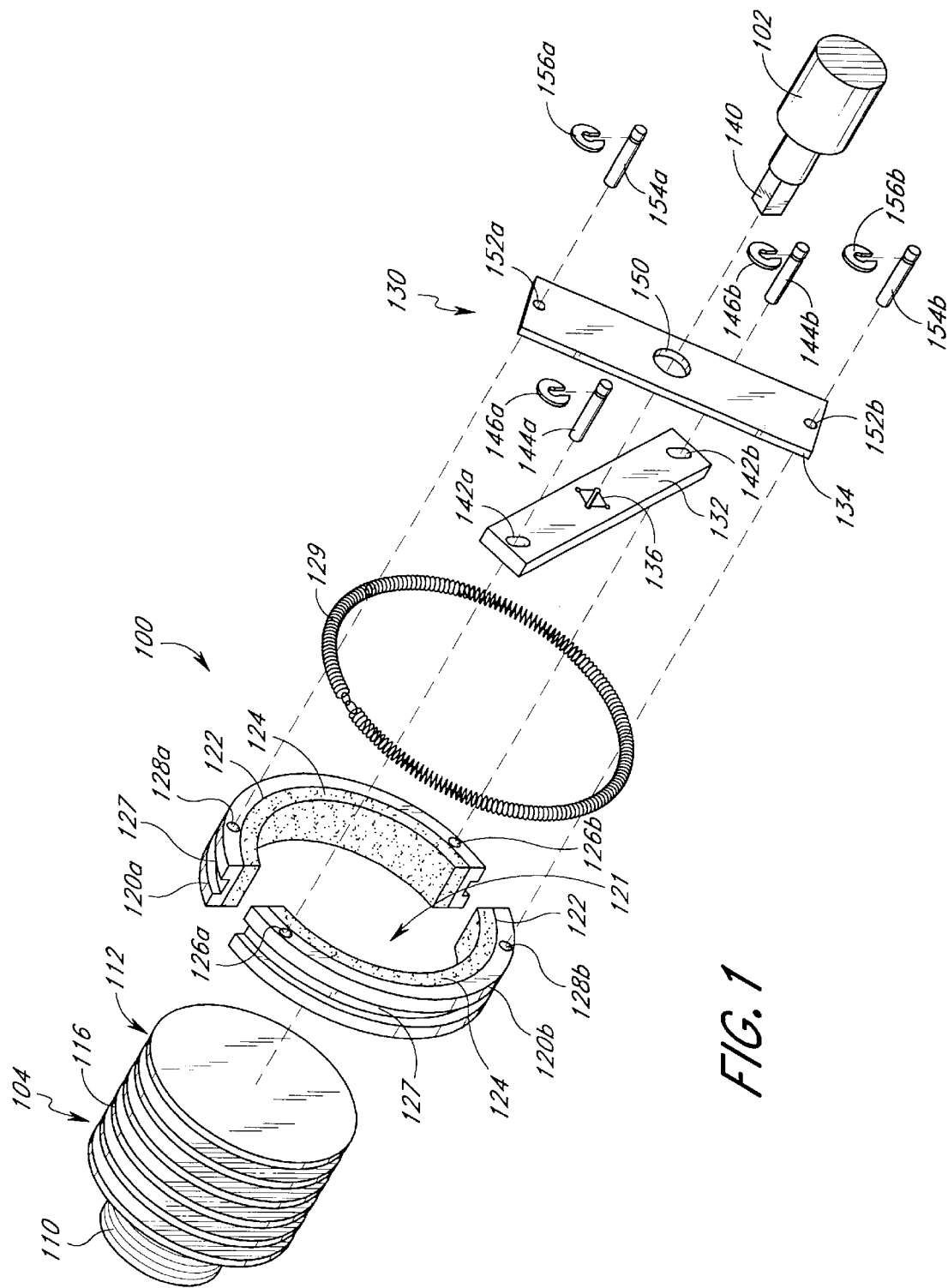
FIG. 1 is an exploded perspective view of the adaptor tool for use with a component having a generally circular cross-section.

Reference will now be made to the drawings wherein like numerals refer to like parts throughout. FIG. 1 is an exploded perspective view illustrating the components of a first embodiment of an adaptor tool 100 that is configured to facilitate the use of a known torque tool 102 in mounting a cylindrical component 104 to a printed circuit board (not shown). The torque tool 102 is preferably comprised of a well-known torque tool that, upon turning of a handle, will result in a pre-selected amount of torque being provided to the component that is being installed. Torque tools of this type are well known in the art and, as will become apparent from the following discussion, this embodiment of the adaptor tool can be modified without departing from the spirit of the present invention to be used with any of a number of well-known torque tools.

The cylindrical component 104 in this embodiment is a cylindrical heat sink that is configured to be mounted on top of an integrated circuit so as to be in thermal engagement with the outer casing of the integrated circuit. Mounting the heat sink 104 in this fashion results in the dissipation of heat generated by the integrated circuit via the heat sink 104. As shown in FIG. 1, the cylindrical heat sink 104 includes a mounting section 110 and a fin section 112. The mounting section 110 is comprised of a helixical thread that is dimensioned so as to be positioned within a bracket that is mounted on the outer casing of an integrated circuit in a well-known manner. The fin section 112 is comprised of a plurality of generally circular fins 116 that dissipate the heat generated by the integrated circuit in a well-known manner. As shown in FIG. 1, this embodiment of a cylindrical heat sink 104 is dimensioned so that the plurality of fins comprising the fin section 112 all have approximately the same outer diameter so that the cylindrical heat sink 104 has a generally uniform outer circumference.

FIG. 1 also illustrates the components which comprise this embodiment of the adaptor tool 100. In particular, this embodiment of the adaptor tool 100 includes a first and a second capture member 120a, 120b that are dimensioned so as to be able to capture the cylindrical component 104 therebetween in the manner that will be described in greater detail below. An inner surface 122 of the captured members 120a and 120b is coated with a cushioning material which in this embodiment is an ionomer foam 124 so that when the capture members 120a and 120b are capturing the cylindrical component 104, the ionomer foam 124 provides greater protection for the outer perimeter of the cylindrical component 104. In particular, it will be appreciated that when the cylindrical component 104 is a cylindrical heat sink, the fins 116 on the heat sink may be subjected to scratches or damage when torque is applied to the adaptor tool 100. Further, the ionomer foam 124 is designed to allow the capture members 120a and 120b to securely capture the outer perimeter of the cylindrical heat sink but still provide some flexibility so that the likelihood of damage to the fins 116 of the cylindrical heat sink 104 is reduced.

Hence, as shown in FIG. 1, the capture members 120a and 120b, in this embodiment, are generally hemispherical in shape. The capture members 120a and 120b are preferably dimensioned so as to define an opening 121 of a first cross-sectional area which is slightly greater than the cross-sectional area of the cylindrical component 104. As will be described in greater detail below, the adaptor tool 100 is configured so that application of torque to the adaptor tool 100 results in the opening 121 defined by the capture members 120a and 120b decreasing in cross-sectional area so that the cushion material 124 is in contact with the outer perimeter of the cylindrical heat sink 104.

As shown in FIG. 1, a groove 127 is formed in the outer surface of both of the capture members 120a and 120b. The grooves 127 are dimensioned so as to receive a spring 129. In this embodiment, the grooves are similar to an "O" ring groove and the spring 129 is positioned within the grooves 127 when the adaptor tool is assembled in the manner shown in FIG. 2. The spring 129 is preferably a garter spring wherein the ends of the spring are attached to each other. When the adaptor tool 100 is fully assembled, the garter spring 129 exerts an inward force against each of the capture members 120a and 120b which helps to maintain the capture members 120a and 120b in a desired orientation with respect to each other. In particular, the spring 129 exerts a force against the capture members 120a and 120b to help the members 120a and 120b define the generally circular opening 121 therebetween during application of torque to the torque tool 100 in the manner that will be described in greater detail below.

FIG. 1 also illustrates that the adaptor tool 100 includes a linkage mechanism 130 that links the first and second capture members 120a and 120b together so that when torque is applied to the linkage mechanism 130 from the torque tool 102, the first and second capture members 120a and 120b move towards each other thereby capturing the cylindrical component 104 therebetween. In the embodiment shown in FIG. 1, the linkage mechanism 130 includes a first linkage member 132 and a second linkage member 134.

The first linkage member 132 includes a torque tool opening 136 that is dimensioned so as to be able to receive a mating end 140 of the torque tool 102. In this embodiment, the torque tool opening 136 in the first linkage member 132 is generally square in shape so as to receive the square mating end 140 of the torque tool 102. Further, the torque tool opening 136 is preferably centrally located between a first and second end of the first linkage member 132.

A slotted opening 142a and 142b is preferably formed at the first and the second ends of the first linkage member 132. The slotted openings 142a and 142b are openings that are configured to respectively receive a pin 144a and 144b which will extend through the openings 142a and 142b into openings 126a and 126b on the capture member 120a and 120b respectively. The pins 144a and 144b are held in place with lock washers 146a and 146b. The slotted configuration of the openings 142a and 142b permit lateral movement of the first capture member 120a with respect to the second capture member 120b in a manner that will be described in greater detail below in reference to FIGS. 4 and 5.

The second linkage member 134 includes a non-engaging opening 150 that is dimensioned and positioned in the member 134 so that the mating end 140 of the torque tool can extend through the opening 150 into the opening 136 in the manner shown below. In this embodiment, the non-engaging opening 150 is dimensioned so as to be substantially circular having a cross-sectional area that is greater than the cross-sectional area of the mating end 140 of the torque tool 102 so that the mating end 140 does not transfer torque to the second linkage member 134.

The second linkage member 134 also includes openings 152a and 152b which are formed at first and second ends of the second linkage member 134. The openings 152a and 152b are adapted to receive pins 154a and 154b respectively that extend through the openings 152a and 152b into the openings 128a and 128b on the capture members 120a and 120b, respectively. Lock washers 156a and 156b hold the pins 154a and 154b in the openings 152a and 152b of the second linkage member 134 and in the openings 128a and 128b in the first and second capture members 120a and 120b.

FIG. 2 shows the adaptor tool 100 in its assembled state while positioned about a cylindrical heat sink 104 with the torque tool 102 engaging with the first linkage member 132. FIG. 2 illustrates that the first linkage member 132 and the second linkage member 134 are respectively attached to opposite ends of the first and second capture members 120a and 120b. The first and second linkage members 132 and 134 thereby form an X-pattern over a top surface 160 of the cylindrical heat sink 104.

The opening 150 in the second linkage member 134 is centered so that the torque tool opening 136 in the first linkage member 132 is positioned within the center of the opening 150 in the second linkage member 134. This allows the mating end 140 of the torque tool to be positioned within the torque tool opening 136 in the manner shown in FIG. 3 without engaging the second linkage member 134. As is shown in FIG. 3, the opening 150 in the second linkage member 134 is dimensioned so that the mating end 140 of the torque tool 102 does not engage with the second linkage member 134.

The openings 152a and 152b in the second linkage member 134 are configured so that the linkage member 134 can only pivot about the pins 154a and 154b when the pins 154a and 154b are installed in the openings 128a and 128b in the capture members 120a and 120b. However, as discussed above, the openings 142a and 142b in the first linkage member 132 are slotted so as to permit lateral movement of the first and second capture members 120a and 120b with respect to each other. Consequently, when the torque tool 102 is positioned so that the mating end 140 is positioned within the torque tool opening 136 and torque is applied in a clockwise direction, the slotted openings 142a and 142b in the second linkage mechanism 130 facilitates lateral movement of the first and second capture members 120a and 120b with respect to each other thereby decreasing the cross-sectional area of the opening 121 until the cushion material 124 engages with the outer perimeter of the component 104.

The spring 129 positioned within the slots 127 on the capture members 120a and 120b help maintain the first and second capture members 120a and 120b in a desired orientation other during the lateral movement of the capture members 120a and 120b with respect to each other. Specifically, the spring 129 exerts a generally radially inward force against the outer surface of the capture members 120a and 120b which reduces the tendency of the capture members 120a and 120b to disengage from the component 104 during the mounting of the component 104.

FIG. 3 is a cross-sectional view which illustrates how the adaptor tool 100 is used to mount the component 104 to a mounting bracket 114. In particular, the adaptor tool 100 is positioned about the outer perimeter of the cylindrical component 104 so that the cylindrical component is positioned inside of the capture members 120a and 120b in the manner shown in FIG. 2. The torque tool 102 is positioned in the square opening 136 on the linkage member 132. The component 104 is positioned adjacent the bracket 114 so that the mounting end 110 is positioned adjacent an opening in the bracket 114. The torque tool 102 is then twisted so that the component 104 is screwed into the opening in the bracket 114. Desirably, the component 104 is tightened in the bracket 114 to a desired torque as the torque tool can be selected so that it only imparts a selected amount of torque. In this manner, electrical components can be tightened in brackets to a known torque value.

FIGS. 4 and 5 illustrate one embodiment of a linkage mechanism that couples the capture members together to transmit torque from the torque tool 102 to the component 104. In particular, the linkage mechanism 130 maintains the first and second capture members 120a and 120b in a prefixed orientation such that there is a gap 170 between the first and second ends of both the first and second capture members 120a and 120b. As shown in FIG. 4, the capture members 120a and 120b in an untorqued orientation, define an opening 121 which is slightly greater than the outer perimeter of the cylindrical component 104. However, as shown in FIG. 5, once torque is applied via the torque tool 102 to the first linkage member 132 via the torque tool opening 136, the gap 170a and 170b becomes smaller thereby reducing the inner perimeter of the opening 121 defined by the capture members 120a and 120b. Consequently, the ionomer foam 124 becomes frictionally engaged with the outer surfaces of the cylindrical component 104. The relative movement of the capture members 120a and 120b is the result of the sliding engagement of the pins 144a and 144b in the openings 142a and 142b which thereby permit lateral movement of the first capture member 120a with respect to the second capture member 120b.

As a result of the torque being applied to the adaptor tool 100, the cylindrical component 104 is preferably captured in the opening 172 between the capture members 120a and 120b and can then be twisted in the direction that the torque tool 102 is being manipulated. Hence, the adaptor tool 100 is configured to be positioned over a cylindrical component 104 and then capture the cylindrical component for subsequent twisting as a result of torque being applied to the torque tool and then transmitted to the component 104. It will be appreciated that as more torque is applied to the linkage 130 from the torque tool, the more the capture members 120a and 120b are urged together. However, the slots 142a and 142b in the first capture member 120a are preferably dimensioned so that for any particular cylindrical component, the amount of force that is exerted against the outer perimeter of the cylindrical component will not result in damage to the cylindrical component. Further, the use of an ionomer foam 124 on the inner surfaces of the capture members 120a and 120b further reduces the likelihood of damage to the cylindrical component as a result of torque being applied to the cylindrical component 104.

The adaptor tool of this embodiment therefore allows torque tools to be used during the installation of cylindrical components on printed circuit boards. As is understood in the art, torque tools can be set so that a maximum amount of torque can be applied to the fasteners thereby reducing the likelihood of damage as a result of the fastener being over-torqued. The adaptor tool 100 of the preferred embodiment allows for the torque tool to be used in conjunction with cylindrical components that are attached directly onto mounts on printed circuit boards so that these components can be mounted on the printed circuit boards with a desired degree of torque. This reduces the problems associated with over-tightening or under tightening these cylindrical components.

Although the foregoing description of the invention has shown, described and pointed out novel features of the invention, it will be understood that various omissions, substitutions, and changes in the form of the detail of the apparatus as illustrated as well as the uses thereof, may be made by those skilled in the art without departing from the spirit of the present invention. Consequently, the scope of the invention should not be limited to the foregoing discussion but should be defined by the appended claims.

What is claimed is:

1. An adapter tool for use with micro-electronics, the tool comprising:

a first capture member having an interior surface coated with cushioning material;

a second capture member having an interior surface coated with cushioning material, wherein the first and the second capture members define a component opening; and a first linking member having a first end which is slidably coupled to the first capture member through a slotted opening, a second end, opposite the first end, which is slidably coupled to the second capture member, and having a connector adapted to receive a torque tool such that application of torque from the torque tool induces the first and second capture members to move with respect to each other so that the cross sectional area of the component opening can be decreased for engaging with a component, wherein the first linking member limits an amount by which the first and second capture members move with respect to one another such that only a selected amount of compressive force can be applied against an outer perimeter of the component.

2. The adapter tool of claim 1, wherein first and the second capture members have a generally semi-circular profile and the component opening is generally circular.

3. The adapter tool of claim 1, further comprising a second linking member having a first end which is rotatably coupled to the first capture member and having a second end opposite the first end which is rotatably coupled to the second capture member.

4. The adapter tool of claim 3, wherein the second linking member further comprises an opening adapted to allow passage of the torque tool through the second linking member to the connector on the first linking member.

5. The adapter tool of claim 1, further comprising a spring encircling the first and second capture members and exerting a compressive force thereto, wherein the spring aids in maintaining a desired orientation of the first and second capture members.

6. The adapter tool of claim 5, further comprising a groove formed in an outer surface of the first and second capture members and wherein the spring is positioned within the groove.

7. The adapter tool of claim 5, wherein the spring is a garter spring.

8. The adapter tool of claim 1, wherein the slotted opening is located on the first linking member.

9. The adapter tool of claim 8, wherein the first capture member comprises a pin which extends through the slotted opening.

10. The adapter tool of claim 1, wherein the second end of the first capture member is coupled to the second capture member through a slotted opening.

11. An adapter tool for use with micro-electronics, the tool comprising:

a first capture member;

a second capture member, wherein the first and the second capture members define a component opening; and a first linking member having a first end which is slidably coupled to the first capture member through a slotted opening and a second end, opposite the first end, which is coupled to the second capture member, the first linking member having a torque tool opening adapted to receive a torque tool, wherein application of torque from the torque tool induces the first and second capture members to move with respect to each other so that the cross sectional area of the component opening can be decreased for engaging with a component and the first linking member limits an amount by which the first and second capture members move with respect to one another such that only a selected amount of compressive force can be applied against an outer perimeter of the component.

12. The adapter tool of claim 11, wherein first and the second capture members have a generally semi-circular profile and the component opening is generally circular.

13. The adapter tool of claim 11, wherein first and the second capture members have an interior surface coated with cushioning material.

14. The adapter tool of claim 11, further comprising a second linking member having a first end which is rotatably coupled to the first capture member and having a second end opposite the first end which is rotatably coupled to the second capture member.

15. The adapter tool of claim 14, wherein the second linking member further comprises an opening adapted to allow passage of the torque tool through the second linking member to the torque tool opening.

16. The adapter tool of claim 11, further comprising a spring encircling the first and second capture members and exerting a compressive force thereto, wherein the spring aids in maintaining a desired orientation of the first and second capture members.

17. The adapter tool of claim 16, further comprising a groove formed in an outer surface of the first and second capture members and wherein the spring is positioned within the groove.

18. The adapter tool of claim 16, wherein the spring is a garter spring.

19. The adapter tool of claim 11, wherein the slotted opening is located on the first linking member.

20. The adapter tool of claim 11, wherein the first capture member comprises a pin which extends through the slotted opening which is located on the first linking member.

21. The adapter tool of claim 11, wherein the second end is coupled to the second capture member through a slotted opening.

* * * * *